United States Patent
Takanashi et al.

(10) Patent No.: US 7,023,288 B2
(45) Date of Patent: Apr. 4, 2006

(54) PIEZOELECTRIC OSCILLATOR AND ITS MANUFACTURING METHOD

(75) Inventors: Hitoshi Takanashi, Kouza-gun (JP); Tsuneo Uchiyama, Kouza-gun (JP); Youji Nagano, Kouza-gun (JP); Kyo Horie, Kouza-gun (JP); Noriyuki Watanabe, Kouza-gun (JP); Kazuhiro Shii, Kouza-gun (JP)

(73) Assignee: Toyo Communication Equipment Co., Ltd., Kanagawa (JP)

( * ) Notice: Subject to any disclaimer, the term of this patent is extended or adjusted under 35 U.S.C. 154(b) by 120 days.

(21) Appl. No.: 10/475,072

(22) PCT Filed: Apr. 17, 2002

(86) PCT No.: PCT/JP02/03809

§ 371 (c)(1),
(2), (4) Date: Oct. 17, 2003

(87) PCT Pub. No.: WO02/087070

PCT Pub. Date: Oct. 31, 2002

(65) Prior Publication Data

US 2004/0113708 A1    Jun. 17, 2004

(30) Foreign Application Priority Data

| Apr. 18, 2001 | (JP) | ............... 2001-119196 |
| Sep. 11, 2001 | (JP) | ............... 2001-274632 |
| Nov. 21, 2001 | (JP) | ............... 2001-355413 |
| Feb. 1, 2002 | (JP) | ............... 2002-026018 |

(51) Int. Cl.
H03B 5/32 (2006.01)
H03B 5/36 (2006.01)

(52) U.S. Cl. .................. 331/108 D; 331/158

(58) Field of Classification Search ........... 331/108 D, 331/116 R, 116 FE, 158
See application file for complete search history.

(56) References Cited

U.S. PATENT DOCUMENTS 5,724,728 A * 3/1998 Bond et al. .................. 29/840
6,750,729 B1 * 6/2004 Kim et al. .................. 311/176

FOREIGN PATENT DOCUMENTS

| JP | 59-91719 | 5/1984 |
| JP | 4-3609 | 1/1992 |
| JP | 4-71019 | 6/1992 |
| JP | 7-336179 | 12/1995 |
| JP | 2001-16036 | 1/2001 |

* cited by examiner

Primary Examiner—David Mis
(74) Attorney, Agent, or Firm—Koda & Androlia

(57) ABSTRACT

A piezoelectric oscillator comprising a piezoelectric vibrator with a piezoelectric vibrating element housed in a package and bottom terminals formed on the outer side of the bottom of the package, a circuit board with at least one electronic circuit component mounted and conductor patterns formed on the top side, and columnlike supports which mechanically and electrically connects the bottom terminals of the piezoelectric vibrator and the conductor patterns on the circuit board. The piezoelectric oscillator has a smaller board occupation area, and can be manufactured by quantity production using a batch process at a high productivity and a reduced cost.

16 Claims, 9 Drawing Sheets

(a)

(b)

(c)

(a)

(b)

(a)

(b)

(a)

(b)

(a)

(b)

(a)

(b)

PIEZOELECTRIC OSCILLATOR AND ITS MANUFACTURING METHOD

FIELD OF THE INVENTION

The present invention relates to the construction and the manufacturing method of a piezoelectric oscillator, more particularly a piezoelectric oscillator of a construction in which a packaged piezoelectric vibrator is fixed above a circuit board with circuit components mounted thereon.

BACKGROUND ART

In a rapid progress in lowering of price and miniaturization with the popularization of mobile communication devices such as cell phones, demand for lower price, smaller size, and lower profile are increasing of piezoelectric oscillators such as crystal oscillators. In response to such demands, not only packaging of crystal vibrators but also the integration of an oscillating circuit including a frequency adjustment circuit and a temperature-compensating circuit is made to reduce the number of parts and the size of devices.

FIG. 11(a) is an exploded perspective view of a conventional crystal oscillator as an example of conventional piezoelectric oscillators. FIG. 11(b) is a longitudinal cross-sectional view of the crystal oscillator.

This crystal oscillator 1 has a construction in which a crystal vibrator 11 is mounted on the top of a lower package 2 formed of ceramic laminations to integrate them into a single device.

The lower package 2 has an outer frame 3 raised along the edge so as to surround the inner part. An IC 6 is fixed to the inner side of the bottom in the depression 4 by means of a binder 5 such as solder, and the terminals 6a formed on the top side of the IC 6 and the bonding pads 7 formed on the inner side of the bottom of the depression are connected by bonding wires 8. In the case of forming the terminals on the bottom side of the IC, the IC may be flip-chip-mounted by connecting the terminals of the IC with the bonding pads 7 by ball bonding. External terminals 9 for surface mounting are formed on the outer side of the bottom of the lower package 2, and the external terminals 9 are connected with the bonding pads 7 by means of conductors not shown in the figure. Top terminals 10 are formed on the top side of the outer frame 3, which are connected with the bonding pads 7. The depression 4 may be filled with an insulating resin to embed the IC 6 in a resin if necessary.

The crystal vibrator 11 has a construction in which a crystal vibrating element 14 is mounted in the depression 13 of a package 12 formed of ceramic laminations, and the depression 13 is hermetically sealed by a metal cover 15. Bottom terminals 16 are formed on the outer side of the bottom of the package 12. The bottom terminals 16 are bonded to the top terminals 10 of the lower package 2 by means of a binder such as a conductive adhesive, and the depression 4 of the lower package 2 is closed by the crystal vibrator 11.

This crystal vibrator 1 could be realized by integrating all circuit components making up an oscillating circuit and a temperature-compensating circuit except the crystal vibrator 11 into a single chip IC 6.

However, to produce the piezoelectric oscillator using the above-described expensive IC 6 with all circuit components integrated into it, it is a prerequisite that there is an expectation of a certain amount of quantity production of the piezoelectric oscillator 1 itself. Without an expectation of quantity production, cost reduction is difficult. Since it is therefore impossible costwise to use this type of expensive IC 6 for piezoelectric oscillators manufactured in large item small volume production, for example. Hence the circuit components for making up the above-described circuits such as transistors, resistors and capacitors, instead of the IC 6, must be mounted in the depression 4 of the lower package 2 in the form of separate chip-shaped parts.

When attempting to mount such chip-shaped circuit components in the depression 4 of the lower package 2 shown FIG. 11, they must be mounted on the lands (formed for mounting chip-shaped circuit components instead of the bonding pads 7) by reflow soldering using cream solder. Application of cream solder to the lands is usually carried out by screen printing using silk screens (masks). However, in the case of the lower package 2 where there is an elevated part, outer frame 3, around the surface on which the lands are formed, the silk-screen printing technique cannot be used. It is therefore difficult to increase the productivity by a batch process using the silk-screen printing, and application of cream solder to the lands in the depression 4 must be carried out one by one by a dispenser. This causes an increase in cost if chip-shaped parts are used.

For this reason, in the case of constructing a piezoelectric oscillator using discrete chip-shaped parts, there is no choice but to use a construction in which lands are formed on the top side of a large-area circuit board and chip-shaped parts 21 and a crystal vibrator 22 are mounted on the lands by reflow soldering as shown in FIG. 12. Since the circuit board 20 of this construction is flat without differences in level and hence the silk-screen printing can be used to apply cream solder to the lands formed on it, a batch process using a large circuit board block, which consists of a large number of the circuit boards for the piezoelectric oscillators arranged side by side in the vertical and horizontal directions, can be used.

However, since all components 21 and 22 are mounted on a flat circuit board, this construction consequently needs a larger board occupation area, bringing a result against the demand for parts suitable for high density mounting.

A purpose of the present invention is therefore to provide a piezoelectric oscillator which can use a flat circuit board to mount circuit components, making it possible to apply cream solder to the lands formed on the circuit board in a batch process for mass production and whose board occupation area can be reduced by three-dimensionally arranging a packaged piezoelectric vibrator above the circuit board.

Another purpose of the present invention is to provide a method of manufacturing the piezoelectric oscillator which makes efficient production using a batch process possible.

SUMMARY OF THE INVENTION

The above-described purposes are accomplished by the following inventions:

The invention of claim 1 is a piezoelectric oscillator characterized by comprising a piezoelectric vibrator with a piezoelectric vibrating element housed in a package and bottom terminals formed on the outer side of the bottom of the package, a circuit board with at least one electronic circuit component mounted and conductor patterns formed on the top side, and columnlike supports which mechanically and electrically connects the bottom terminals of the piezoelectric vibrator and the conductor patterns on the circuit board.

The invention of claim 2 is a piezoelectric oscillator comprising a flat circuit board with circuit components making up an oscillating circuit mounted on the top side and external terminals formed on the bottom side and a piezoelectric vibrator fixed above the circuit board with a predetermined space by columnlike supports fixed to the top side of the circuit board, characterized in that the piezoelectric vibrator has a piezoelectric vibrating element hermetically sealed in a package and bottom terminals connected with the excitation electrodes of the piezoelectric vibrating element formed on the outer side of the bottom of the package; and the columnlike supports are separate parts from the piezoelectric vibrator and the circuit-board, the bottom of the columnlike supports being mechanically and electrically fixed to lands formed on the top side of the circuit board, and the top of the columnlike supports being mechanically and electrically bonded to the bottom terminals of the piezoelectric vibrator.

The invention of claim 3 is a piezoelectric oscillator comprising a flat circuit board with at least circuit components making up an oscillating circuit mounted on the top side and external terminals formed on the bottom side and a piezoelectric vibrator, fixed together and electrically connected by means of columnlike supports, characterized in that: the columnlike supports are small pieces of an insulating material with conductors formed on the top and the bottom and connected by a connecting conductor; the circuit board has support-fixing lands for bonding the conductors on the bottoms of the columnlike supports thereto formed on the top side; and the piezoelectric vibrator houses a piezoelectric vibrating element in a hermetically sealed package and has bottom terminals to be bonded to the conductors on the tops of the columnlike supports formed on the bottom of the package.

The invention of claim 4 is a piezoelectric oscillator of any one of claims 1 to 3, wherein said columnlike supports are ceramic blocks with conductors formed on the top and the bottom and connected by a connecting conductor.

The invention of claim 5 is the piezoelectric oscillator of any one of claims 1 to 3, wherein said columnlike supports are metal blocks or metal balls.

The invention of claim 6 is a piezoelectric oscillator of any one of claims 1 to 3, wherein circuit components with the highest mounted height are used for said columnlike supports.

The invention of claim 7 is a piezoelectric oscillator of any one of claims 1 to 6, wherein said columnlike supports are circular, elliptic, or oval in cross section.

The invention of claim 8 is a method of manufacturing a piezoelectric oscillator comprising a flat circuit board with at least circuit components making up an oscillating circuit mounted on the top side and external terminals formed on the bottom side and a piezoelectric vibrator fixed together and electrically connected by columnlike supports with conductors formed on the top and bottom and connected by a connecting conductor, characterized by comprising the following steps: forming the circuit patterns, support-fixing lands and terminals for the piezoelectric oscillator in each partition on a large mother circuit board; mounting the circuit components for the piezoelectric oscillator on each partition on the mother circuit board to form a block of the circuit boards of the piezoelectric oscillators; making a block of the columnlike supports which are disposed to fit on the support-fixing lands of the corresponding circuit boards of the block of the circuit boards, and fixing the columnlike supports of the block of the columnlike supports to the support-fixing lands on the corresponding circuit boards of the block of the circuit boards, electrically connecting the conductor on the bottom of each columnlike support and the support-fixing land by putting the block of the columnlike supports onto the block of the circuit boards; cutting the block of the circuit boards together with the block of the columnlike supports to separate the individual circuit boards, and mounting the crystal vibrator on the columnlike supports of each circuit board by bonding the bottom terminals of the piezoelectric vibrator to the conductors on the tops of the columnlike supports.

The invention of claim 9 is a method of manufacturing a piezoelectric oscillator of claim 8, wherein the block of the columnlike supports comprises a latticework part with holes corresponding to the circuit boards of the block of the circuit boards and the columnlike supports projecting from the latticework part into each hole so as to fit on the support-fixing lands of the corresponding circuit board.

The invention of claim 10 is a piezoelectric oscillator comprising a flat circuit board with circuit components making up an oscillating circuit mounted on the top side and bottom terminals formed on the bottom side and a piezoelectric vibrator held above the circuit board with a predetermined space by a support frame, characterized in that; the piezoelectric vibrator has a piezoelectric vibrating element housed in a hermetically sealed package and bottom terminals on the outer side of the bottom of the package; the support frame has terminals for connecting the bottom terminals of the piezoelectric vibrator thereto on the top side and terminals for being connected to the circuit board formed on the bottom side; and the circuit board has a larger surface area than the outside dimensions of the support frame, and has lands for connecting the bottom terminals of the support frame thereto and lands for mounting circuit components thereon inside and outside the support frame on the top side of the circuit board.

The invention of claim 11 is a piezoelectric oscillator of claim 10, wherein a plurality of metals are used instead of the support frame.

The invention of claim 12 is a piezoelectric oscillator comprising a flat circuit board with circuit components making up an oscillating circuit mounted on the bottom side and external terminals formed on the top side and a piezoelectric vibrator with bottom terminals formed on the bottom of the package, fixing together by bonding the external terminals of the circuit board and the bottom terminals of the piezoelectric vibrator; and metal balls serving as supports and external terminals are fixed to the bottom side of the circuit board.

The invention of claim 13 is a piezoelectric oscillator, characterized by having a piezoelectric vibrating element housed in a hermetically sealed package, circuit patterns for an oscillating circuit and lands for fixing supports thereto formed on the bottom of the package, and circuit components and metal balls serving as supports and external terminals mounted on the bottom.

DETAILED EXPLANATION OF THE PREFERRED EMBODIMENTS

Figure 1:
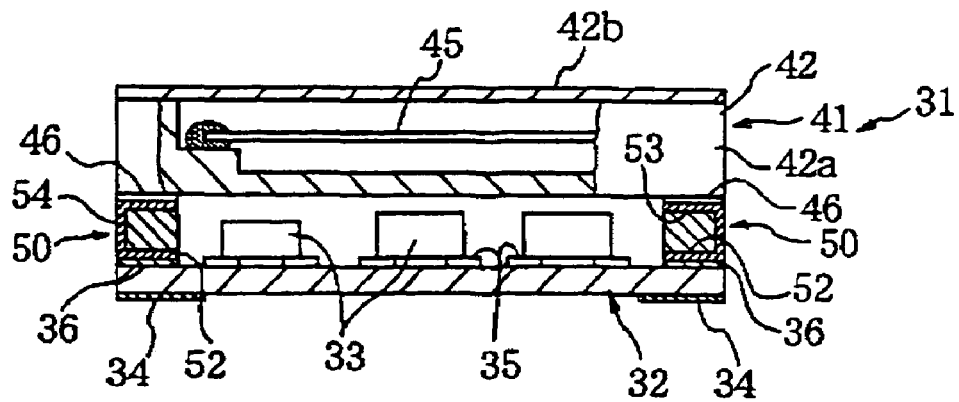
FIG. 1 is a longitudinal sectional view of the fist embodiment of the piezoelectric oscillator according to the present invention.

The present invention is described below in detail with reference to the embodiments shown in the drawings.

Figure 2:
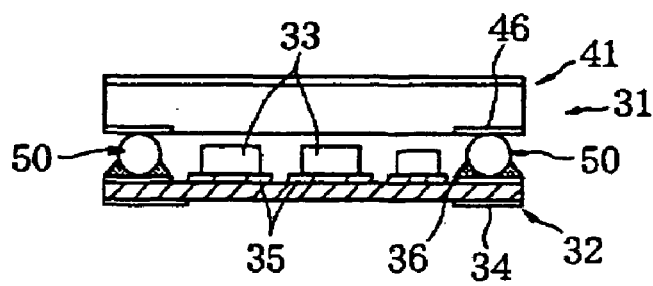
FIGS. 2 is a side view showing the construction of a variation of the piezoelectric oscillator of the fist embodiment of the piezoelectric oscillator according to the present invention.
Figure 3:
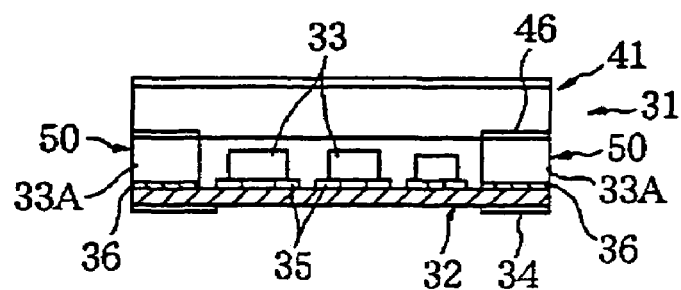
FIGS. 3 is a side view showing the construction of another variation of the piezoelectric oscillator of the fist embodiment according to the present invention.

Referring to FIGS. 1 to 3, the first embodiment of the piezoelectric oscillator according to the present invention is described. The first embodiment is a piezoelectric oscillator 31 comprising a circuit board 32 with circuit components 33 making up an oscillating circuit and a temperature-compensating circuit mounted on the lands 35 formed on the top side and external terminals 34 formed on the bottom side and a piezoelectric vibrator 41 fixed above the top side of the circuit board 32 with a predetermined space, characterized in that the piezoelectric vibrator 41 is fixed above the piezoelectric vibrator by means of columnlike supports 50 which are separate parts from both the circuit board 32 and the piezoelectric vibrator 41 and whose bottoms are mechanically and electrically fixed to the support-fixing-lands 36 formed on the top side of the circuit board 32 and whose tops the bottom terminals of the piezoelectric vibrator are mechanically and electrically bonded to.

First, the example shown in FIG. 1 has a construction in which the columnlike supports 50 are fixed to the support-fixing lands 36 on the flat ceramic circuit board 32 and a crystal vibrator 41 is mounted on the tops of the columnlike supports 50. The circuit board 32 has the circuit components 33 mounted on the lands 35 formed on the top side, and has external terminals 34, each connected with the corresponding lands 35, formed on the bottom side. Further, the circuit board 32 has the support-fixing lands 36 formed on the top side.

The piezoelectric vibrator 41 comprises a package 42 consisting of the main body of package 42a with a depression and a metal cover 42b hermetically sealing the depression and a crystal vibrating element 45. The main body of package 42a is provided with bottom terminals 46 on the bottom. The bottom terminals 46 are connected to the electrodes of the crystal vibrating element 45. The package 42 is made of ceramic, for example.

The columnlike supports 50 of this embodiment each comprise a ceramic block 51 in the shape of a polygonal prism such as a square prism (about 0.3 to 0.5 mm in thickness), bottom terminal 52 (metallized area) formed on the bottom end of the ceramic block 51, top terminal 53 (metallized area) formed on the top end of the ceramic block 51, and conductor 54 electrically connecting the bottom terminal 52 and the top terminal 53.

Since the columnlike supports 50 of this embodiment are separate parts from both the circuit board 32 and the crystal oscillator 41, they can be fixed to the support-fixing lands 36 on the circuit board 32 by applying cream solder to the support-fixing lands 36 using silk-screen printing and reflowing the solder. In the silk-screen printing process, application of cream solder to the lands 35 is carried out at the same time. The circuit components 33 and the columnlike supports 50 are then placed on the lands 35 and the support-fixing lands 36. The circuit board 32 with the circuit components 33 and the columnlike supports 50 placed on it is heated in a reflow furnace and then cooled down. The circuit components 33 and the columnlike supports 50 are thereby joined to the circuit board 32.

The crystal vibrator 41 may be fixed to the columnlike supports 50 by bonding the bottom terminals 46 to the top terminals 53 of the columnlike supports 50 with a conductive adhesive or any other means after the columnlike supports 50 are fixed to the circuit board 32. The crystal vibrator 41 may also be joined to the columnlike supports 50 at the same time as the circuit components 33 and the columnlike supports 50 are joined to the circuit board 32. Since the columnlike supports 50 are separated parts from both the circuit board 32 and the crystal vibrator 41, it is made possible to carry out the mounting and joining of the circuit components 33 and the columnlike supports 50 to a large number of the circuit boards 32 in a batch process. More specifically, cream solder is applied to all lands 35 and 36 on a large-area mother circuit board, which is formed of a plurality of the circuit boards for the piezoelectric oscillators connected side by side in the vertical and horizontal directions, by silk-screen printing. The circuit components 33 and the columnlike supports 50 are then put on the lands 35 and 36, and the mother circuit board is heated in a reflow furnace to join the circuit components and the columnlike supports to the lands 35 and 36. By this batch process, the productivity of the piezoelectric oscillators can be significantly increased.

In addition, since the crystal vibrator 41 is held above the top side of the circuit board 32 with a predetermined space in parallel with the top side, the circuit components can be mounted under the crystal vibrator 41 and hence the area required to mount the piezoelectric oscillator 31 can be decreased.

Furthermore, by disposing the columnlike supports 50 only between the terminals 46 and the support-fixing lands 36 and making the bottom area of each columnlike support 50 as narrow as possible, the effective area on the top side of the circuit board 32, which is used to used to mount the circuit components thereon, can be increased.

In another example of the first embodiment, metal blocks in the shape of a polygonal prism such as a square prism about 0.3 to 0.5 mm in thickness, instead of the ceramic blocks 51, are used for the columnlike supports 50. By using the columnlike supports made of a conductive material and joining them to the support-fixing lands 36 and the bottom terminals 46 of the crystal vibrator by soldering or any other method, the same construction as the piezoelectric oscillator shown in FIG. 1 can be realized. By this example, the process for forming the terminals 52 and 53 and connecting conductors 54 required in the case of using ceramic blocks can be eliminated.

Further, metal balls about 0.3 to 0.5 mm in diameter, instead of metal blocks, may also be used for the columnlike supports 50 as shown in FIG. 2. The metal balls can be joined to the support-fixing lands 36 and the bottom terminals 46 of the crystal vibrator by reflow-soldering with cream solder or by bonding with a conductive adhesive.

In this case, as well as in the case of using metal blocks, the process for forming the terminals 52 and 53 and connecting conductors 54 required in the case of using ceramic blocks can be eliminated.

FIG. 3 shows still another example of the first embodiment of the piezoelectric oscillator according to the present invention. The same parts as those of the embodiment shown in FIG. 1 are represented by the same numerals. This embodiment differs from that of FIG. 1 in using the highest circuit components 33A among the chip-shaped circuit components 33 for the columnlike supports 50.

In the example shown in FIG. 3, two or more circuit components 33A having the highest mounted height are mounted at the positions of the circuit components, and the crystal vibrator 41 are fixed to the tops of the circuit components 33A. The tops of the circuit components 33A are provided with terminals for electrical connection with the bottom terminals 46 of the crystal vibrator 41. Conductors for connecting the top terminals with the circuit on the circuit board are also formed, though not shown in the figure.

It is an important condition that the circuit components 33A used for the columnlike supports have substantially the same height, but their disposition on the circuit board 32 is not limited to that shown in the figure.

By this embodiment, since two or more circuit components selected from the circuit components 33 are used for the columnlike supports, the number of the parts can be decreased, the cost can be reduced, and the area of the circuit board 32 can be made smaller.

Figure 4:
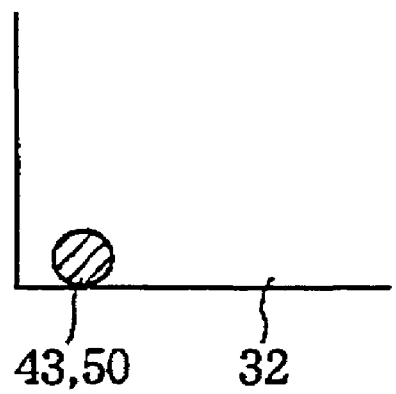
FIG. 4(*a*) to (*c*) shows a possible protrusion of the columnlike supports from the edge of the circuit board by disposition.
Figure 4:
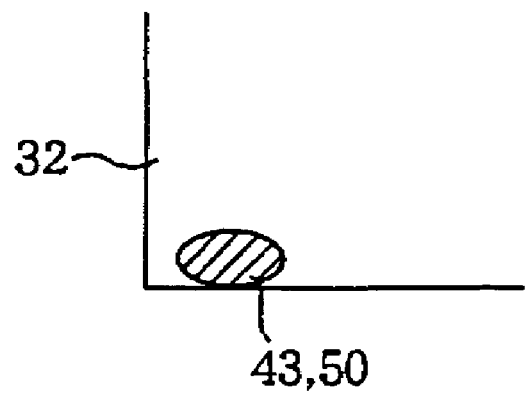
Figure 4:
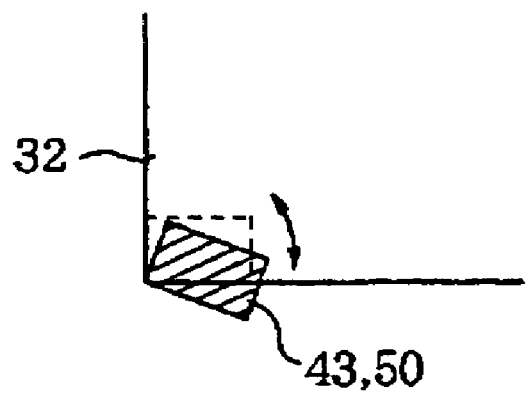

FIGS. 4(a) and (b) show the bottom shapes of the columnlike supports of the second embodiment of the piezoelectric oscillator according to the present invention. This embodiment uses the columnlike supports 50 whose bottom shape (cross section) is a circle or an ellipse (including oval). By using the columnlike supports of such a round cross section, the columnlike supports can be prevented from protruding from the edge of the circuit board 32 if they move out of place in the direction of rotation in the process for fixing them to the circuit board 32.

In the case where the shape of the bottom of the columnlike supports 50 is a polygon, e.g. a rectangle as shown in FIG. 4(c), the columnlike supports are fixed to the circuit board 32 with a corner portion protruded from the edge of the circuit board 32 if the columnlike supports 50 move out of the correct position shown by the broken line in the direction of rotation for some reason or other. The protruded corner portion can form a burr which can cause problems.

However, by forming the bottom of the columnlike supports 50 in the shape of a circle or ellipse without corners as shown in FIGS. 4(a) and 4(b), the columnlike support 50 does not readily protrude from the edge of the circuit board if it moves out of the correct position in the direction of rotation. Further, if the side of the columnlike support 50 slightly protrudes from the edge of the circuit, the protruded part, unlike a protruded corner, does not form a burr which can cause problems.

Figure 5:
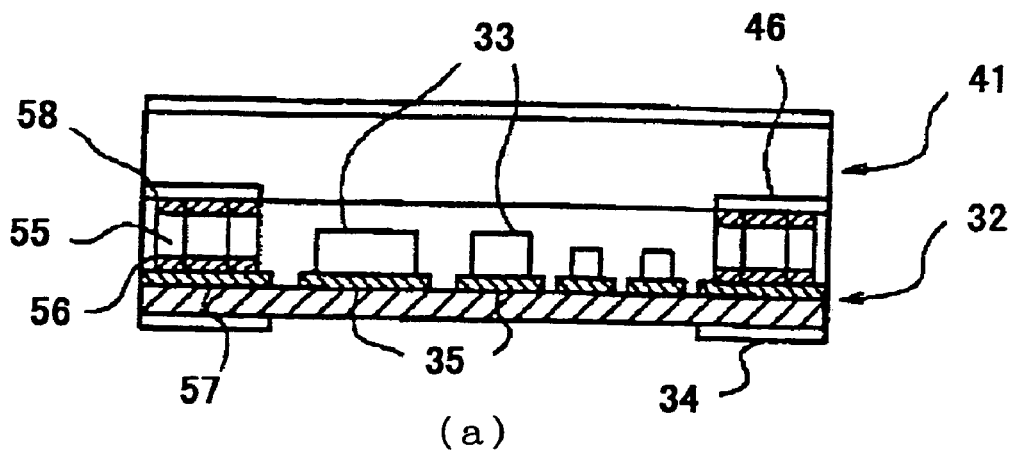
FIGS. 5(a) and (b) are a sectional view and an exploded perspective view of the third embodiment of the piezoelectric oscillator according to the present invention.
Figure 5:
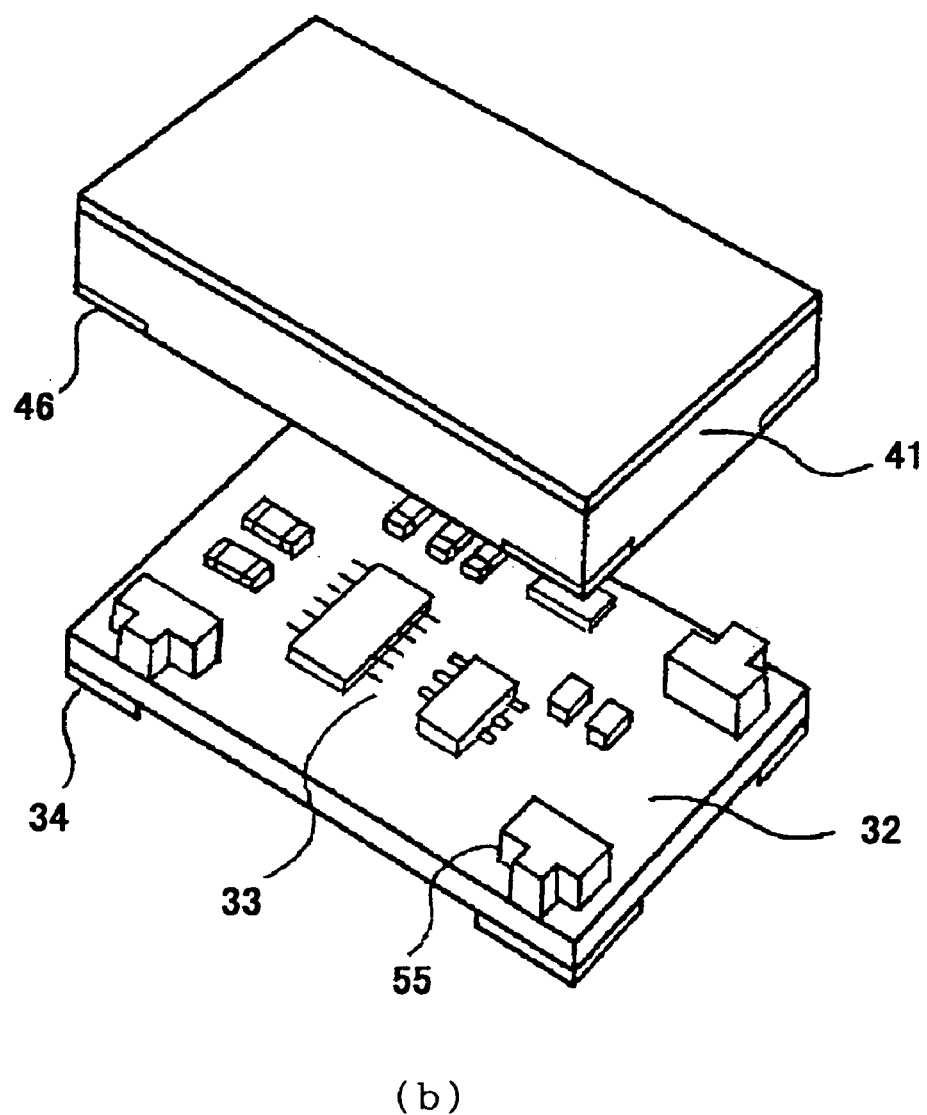

FIGS. 5(a) and (b) show a longitudinal section and an exploded perspective view of the third embodiment of the piezoelectric oscillator according to the present invention. The piezoelectric oscillator shown in the figures comprises a circuit board 32 with circuit components 33 making up an oscillating circuit and a temperature-compensating circuit mounted on the lands 35 formed on the top side and external terminals 34 formed on the bottom side and a crystal vibrator 41 held above the top side of the circuit board 32 with a predetermined space by columnlike supports 55 fixed to the top side of the circuit board 32. The bottom terminals 56 on the bottoms of the columnlike supports 55 are mechanically and electrically fixed to the support-fixing lands 57 formed on the top side of the circuit board 32, and the top terminals 58 on the tops of the columnlike supports 55 are mechanically and electrically fixed to the bottom terminals 46 of the crystal vibrator 41.

The columnlike supports 55 are made by forming holes in a ceramic plate as described later in detail. The ceramic plate has a thickness equal to the predetermined height of the columnlike supports, which is greater than the highest mounted height of the circuit components 33 on the circuit board 32. The columnlike supports 55 have a bottom terminal 56 and a top terminal 58 formed on the bottom and top sides, and a conductor connecting both terminals.

The crystal vibrator 41 is mounted on the columnlike supports 55 by bonding the bottom terminals to the top electrodes of the columnlike supports 55 with a conductive adhesive after the columnlike supports 55 are fixed to the circuit board 32.

Figure 6:
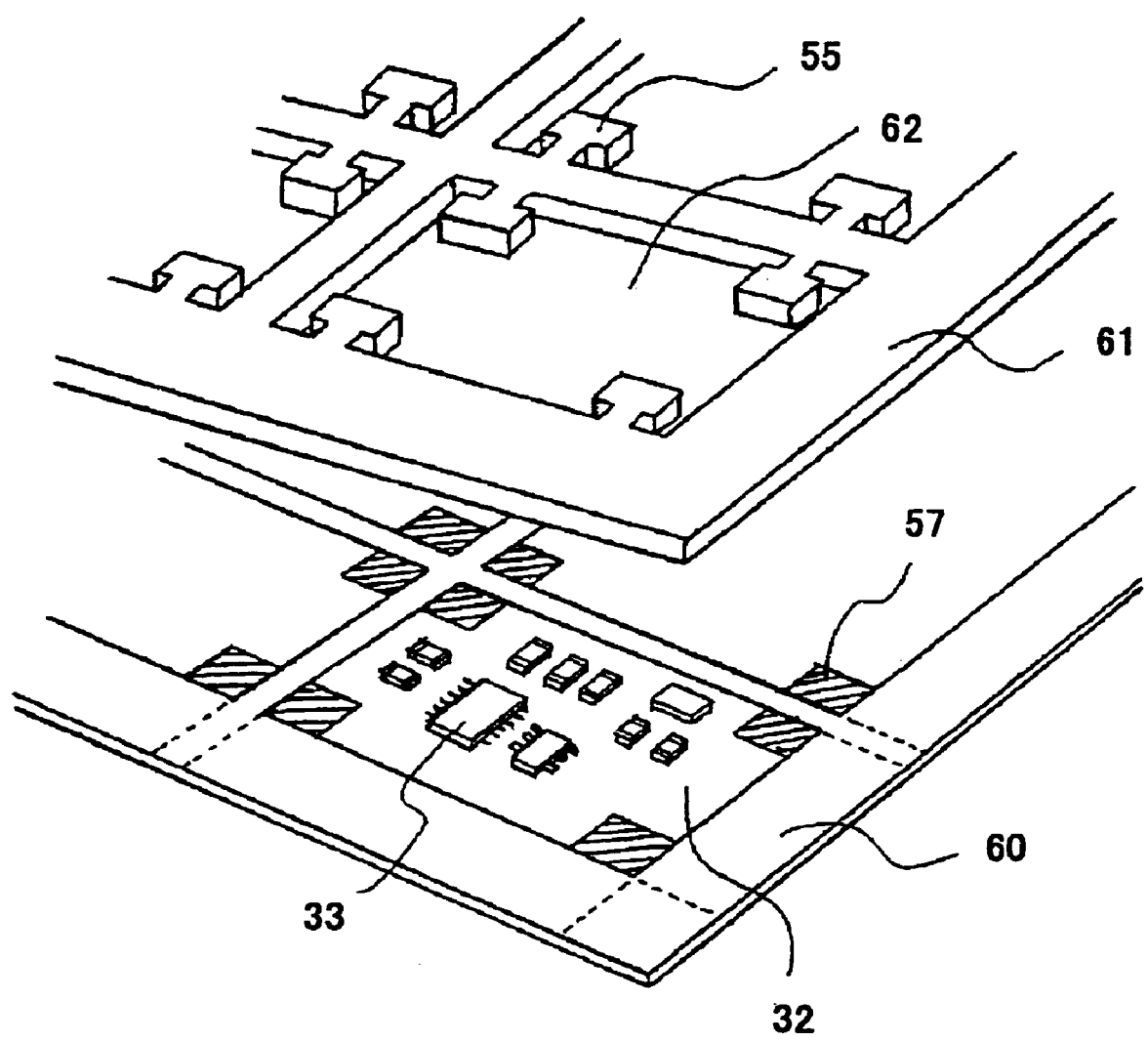
FIG. 6 shows a method of manufacturing the third embodiment of the piezoelectric oscillator according to the present invention.

FIG. 6 shows the method of manufacturing the circuit boards and the columnlike supports and the method of fixing the columnlike supports to the circuit boards in the case of the third embodiment. As shown in the figure, a large number of the circuit boards 32 for the piezoelectric oscillators are formed on a large-area mother circuit board to produce a circuit board block 60, and a large number of the columnlike supports for the piezoelectric oscillators are formed in a large-area mother ceramic plate 61 to produce a columnlike supports block 62.

More specifically, the columnlike supports block 62 consists of a latticelike part defining the holes corresponding to the circuit boards 32 of the circuit board bock 60 and columnlike supports 55 projecting into the holes from the latticelike part. The columnlike supports block 62 are produced by forming holes in a mother ceramic plate 61. The columnlike supports 55 are disposed so as to fit on the corresponding support-fixing lands 57 on the corresponding circuit boards 32. The top and bottom sides of the columnlike supports block 61 are metallized. The columnlike supports 55 have one or more through holes for connecting the metal layers on the top and bottom sides formed at predetermined positions. The thickness of the columnlike supports block 61 is determined according to the heights of the circuit components 33 mounted on the circuit board 32.

Next, the method of fixing the columnlike supports to the circuit boards of the piezoelectric oscillators is described below.

After the circuit board block 60 is manufactured, cream solder is applied to all the lands 35 for the circuit components 33 on the circuit board block 60 by silk-screen printing, the circuit components 33 are placed onto the lands, the circuit board block 60 with the circuit components thereon is heated in a reflow furnace, and the circuit-formed board 60 is cooled to join the circuit components 33 to the lands.

Thereafter or separately, the columnlike supports block 61 is manufactured by forming holes in a mother ceramic plate 61. Next, a conductive adhesive is applied to the support-fixing lands 57 of the circuit boards 32 of the circuit board block 60, and the columnlike supports block 61 is placed on the circuit board block 60, aligning the position of the columnlike supports block 62 with the circuit board block 60 so that the columnlike supports fit on the corresponding support-fixing lands 57. The columnlike supports in columnlike supports block 61 are thus bonded to the support-fixing lands of the circuit board block 60 at one time. The circuit board block 60 and the columnlike supports block 61 are then cut together along the position shown by the broken line by means of a dicing saw, and the circuit board 32 with the circuit components 33 and the columnlike supports 55 mounted thereon are separated.

In another method of fixing the columnlike supports 55 of the columnlike supports block 61 to the support-fixing lands 57 on the circuit board block 60, first the columnlike supports 55 of the columnlike supports block 61 are bonded to the support-fixing lands 57 on the circuit board block 60 with a conductive adhesive. Next, cream solder is applied to the lands 35 for the circuit components 33 by silk-screen printing, the circuit components 33 are mounted, and the circuit components 33 are joined to the lands 35 by heating in a reflow furnace.

In still another method of fixing the columnlike supports 55 of the columnlike supports block 61 to the support-fixing lands 57 on the circuit board block 60, cream solder is applied to the lands 35 for the circuit components 33 and the support-fixing lands 57, the circuit components are mounted on the lands 35, the columnlike supports block 61 is placed on the circuit board block 60, and the circuit components 33 and the columnlike supports 55 are joined to the lands 35 and the support-fixing lands 57 by heating in a reflow furnace.

By this method, since the columnlike supports are manufactured by forming a plurality of the columnlike supports in a single mother ceramic plate, the heights of the columnlike supports are accurately the same, defects in mounting of the crystal oscillators caused by the dimensional errors in the height of the columnlike supports can be prevented. In addition, since the columnlike supports can be fixed to a large number of the circuit boards in a batch by placing a columnlike supports block on a circuit board block, an effective production is made possible.

Further, by using a columnlike supports block formed in a large-area mother ceramic plate, it is made unnecessary to mount the columnlike supports on the support-fixing lands on each circuit board one by one. Further, since the top and bottom orientation of the columnlike supports, which is important when mounting the columnlike supports, is fixed, mounting errors of the columnlike supports can be prevented. Furthermore, displacement of the columnlike supports out of the lands which can occur when the columnlike supports are put on cream solder can be prevented. Consequently, the efficiency of the manufacturing process is significantly improved.

After the circuit board 32 with the circuit components 33 and the columnlike supports 55 mounted thereon is manufactured, a conductive adhesive is applied to the top terminals 58 of the columnlike supports 55, and the bottom terminals 46 of the crystal vibrator 41 are bonded to the top terminals 58 to complete the piezoelectric oscillator.

Though the case of using ceramic columnlike supports is explained, columnlike supports made of glass epoxy or any other resin may also be used. By using the columnlike supports made of such a material, shocks applied to the crystal oscillator can be absorbed.

FIGS. 7(a) and 7(b) show the fourth embodiment of the piezoelectric oscillator according to the present invention, FIG. 7(a) being a sectional view, and FIG. 7(b) an exploded perspective view. This embodiment is characterized in that the size of the circuit board for mounting the circuit components thereon is a little larger than that of the crystal vibrator held above the circuit board by means of a support frame. By this construction, a circuit components-mountable area which are not covered by the mounted crystal vibrator is made available, and circuit components such as capacitors for fine adjustment of the oscillating frequency can be mounted on the area for addition or easy replacement. Further, since the circuit components are all mounted on a flat surface, application of cream solder by silk-screen printing can be used.

Specifically, the fourth embodiment has a construction in which a flat circuit board 71 with circuit components 33 making up an oscillating circuit and a temperature-compensating circuit and circuit components 70 for adjustment of the oscillating frequency mounted on the top side and external terminals 34 formed on the bottom side and a crystal vibrator 41 held above with a predetermined space by a support fame 72 attached to the top side of the circuit board 71 are integrated into a single piezoelectric oscillator.

On the top side of the circuit board 71, lands 35 for mounting circuit components making up an oscillating circuit and a temperature-compensating circuit thereon, lands 73 for mounting circuit components 70 for adjustment of the oscillating frequency, and lands 36 for fixing a support frame 72 are formed. The circuit components 33 and 70 and the support frame 72 are joined to the circuit board 71 by applying cream solder to the lands using silk-screen printing, placing the circuit components 33 and 70 and the support frame 72 on the lands, and reflowing the solder. Since the circuit components 70 for adjustment are mounted outside the support frame 72, replacement or addition of the circuit components 70 for adjustment can be easily made when a fine adjustment of the oscillating frequency is required.

The support frame 72 may be fixed to the circuit board 71 by bonding it to the lands 36 with a conductive adhesive after the circuit components 33 and 70 are joined to the lands 35 and 37 by reflow soldering.

The crystal vibrator 41 has a construction in which a crystal vibrating element 45 is mounted in the depression of a ceramic package 42a and the depression is hermetically sealed by a metal cover. External terminals 46, which are connected with the electrodes of the crystal vibrating element 45, are formed on the outer side of the bottom of the ceramic package 42.

The crystal vibrator 41 is then mounted on the support frame 72 by bonding the external terminals 46 to the top terminals 74 of the support frame 72 to complete the piezoelectric oscillator.

FIGS. 8(a) and (b) show the fifth embodiment of the piezoelectric oscillator according to the present invention. FIG. 8(a) is a sectional view and FIG. 8(b) is a plan view showing the top view of the circuit board with circuit components and supports mounted thereon. The difference of the fifth embodiment from the fourth embodiment is that the fifth embodiment uses metal balls, instead of the support frame, are used for holding the crystal vibrator above the circuit board with a predetermined space.

Specifically, the fifth embodiment has a construction in which a flat circuit board 71 with circuit components 33 making up an oscillating circuit and a temperature-compensating circuit and circuit components 70 for adjustment of the oscillating frequency mounted on the top side and external terminals 34 formed on the bottom side and a crystal vibrator 41 held above with a predetermined space by a metal balls 80 fixed to the top side of the circuit board 71 are integrated into an oscillator.

On the top side of the circuit board 71, lands 35 for mounting circuit components making up an oscillating circuit and a temperature-compensating circuit thereon, lands 73 for mounting circuit components 70 for adjustment of the oscillating frequency thereon, and lands 36 for fixing metal balls 80 are formed. The circuit components 33 and 70 and the metal balls 80 are joined to the circuit board 71 by applying cream solder to the lands using silk-screen printing, placing the circuit components 33 and 70 and the metal balls 80 on the lands, and reflowing the solder. Since the circuit components 70 for adjusting the oscillating frequency are mounted outside the space under the crystal vibrator 41, the replacement or addition of the circuit components 70 for frequency adjustment can be s easily made without removing the crystal vibrator 41 and further the circuit components 33 when an fine adjustment of the oscillating frequency is required as described later.

Figure 7:
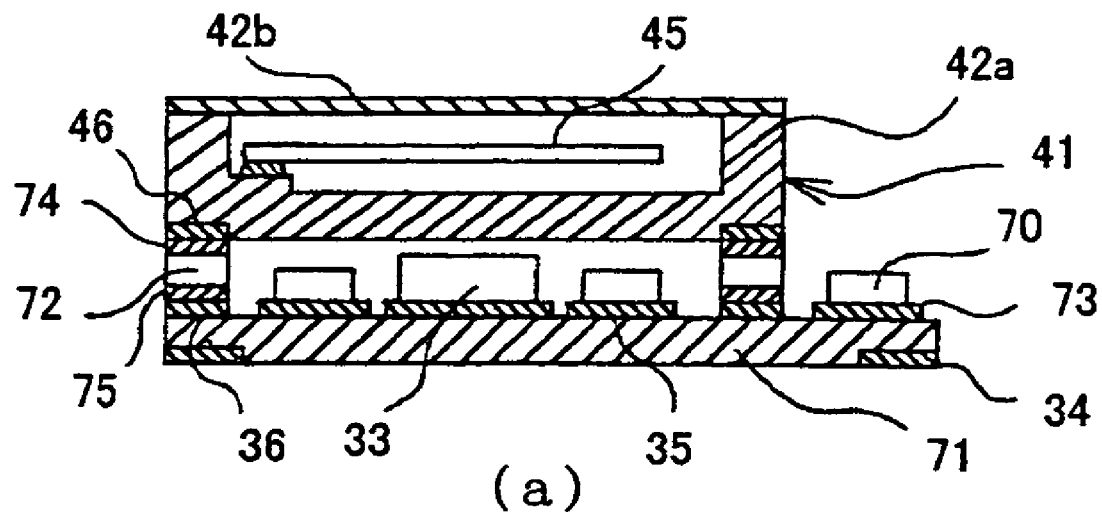
FIGS. 7(a) and (b) are a sectional view and an exploded perspective view of the fourth embodiment of the piezoelectric oscillator according to the present invention.
Figure 7:
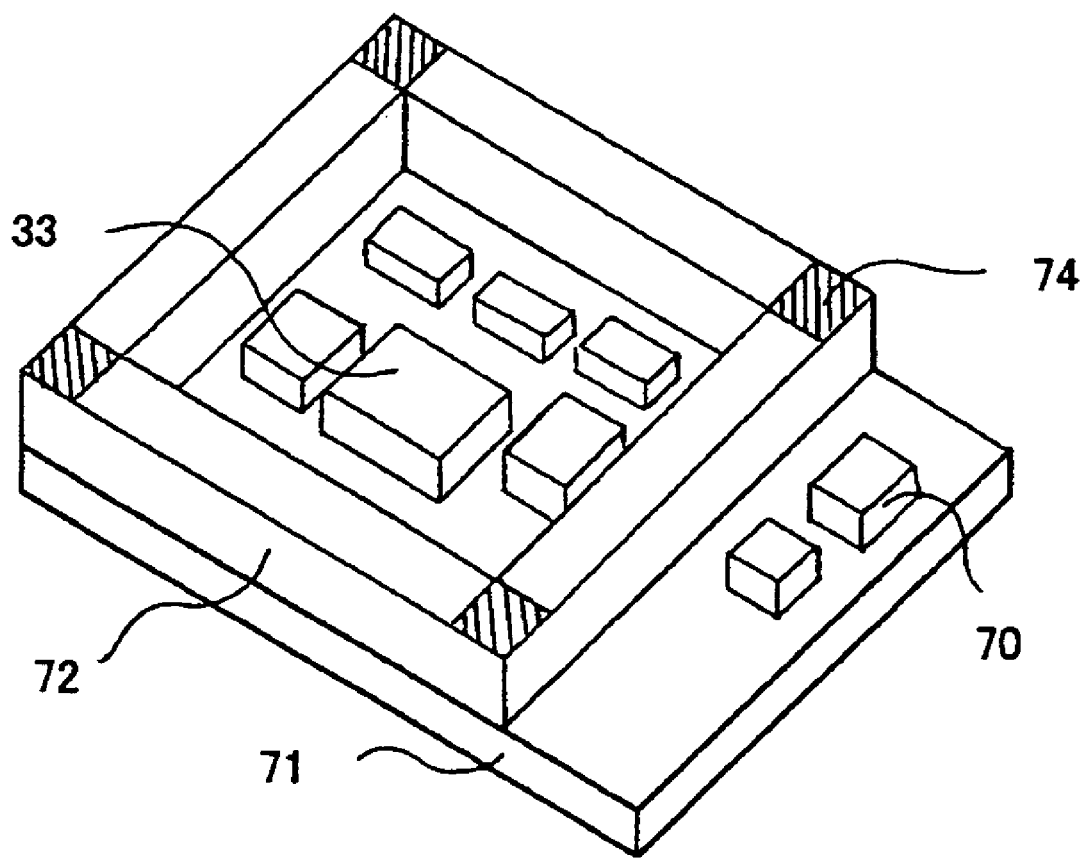

Next, the crystal vibrator 41, which is constructed as illustrated in FIG. 7, is mounted on the balls 80 bonding the external terminals 46 to the metal balls by means of a conductive adhesive or solder to complete the piezoelectric oscillator.

The circuit components 33 and 70 and the metal balls 80 may also be fixed to the circuit board 71 with a conductive adhesive to prevent solder from melting because of an excessive rise in temperature of the piezoelectric oscillator, thereby causing the circuit components and the metal balls to move out of place.

Since ball-shaped supports, unlike prism-shaped supports, do not have corners, the alignment of the mounted direction of the supports is not required. The use of ball-shaped supports has therefore the advantage of being able to simplify the fabricating process in comparison with the construction using prism-shaped supports.

Figure 8:
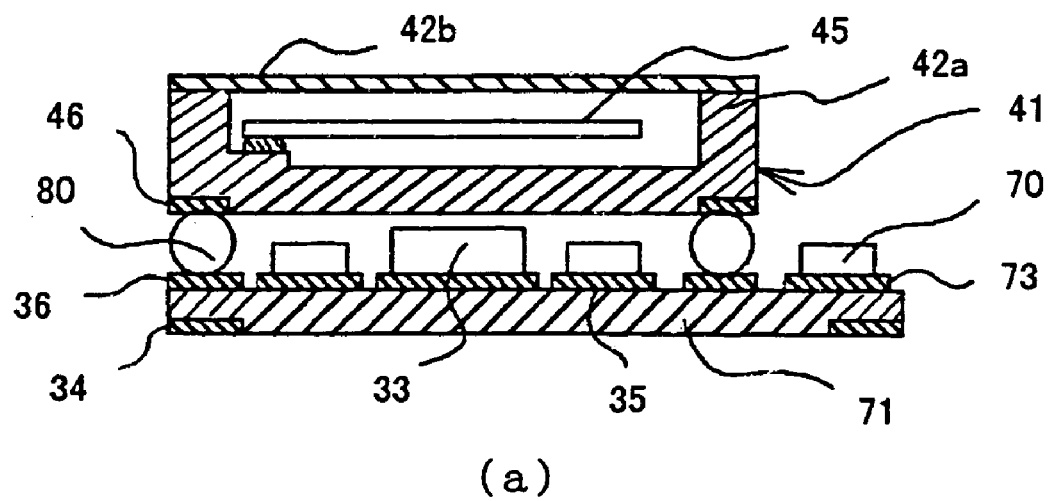
FIGS. 8(a) and (b) are a sectional view and a plan view of the fifth embodiment of the piezoelectric oscillator according to the present invention.
Figure 8:
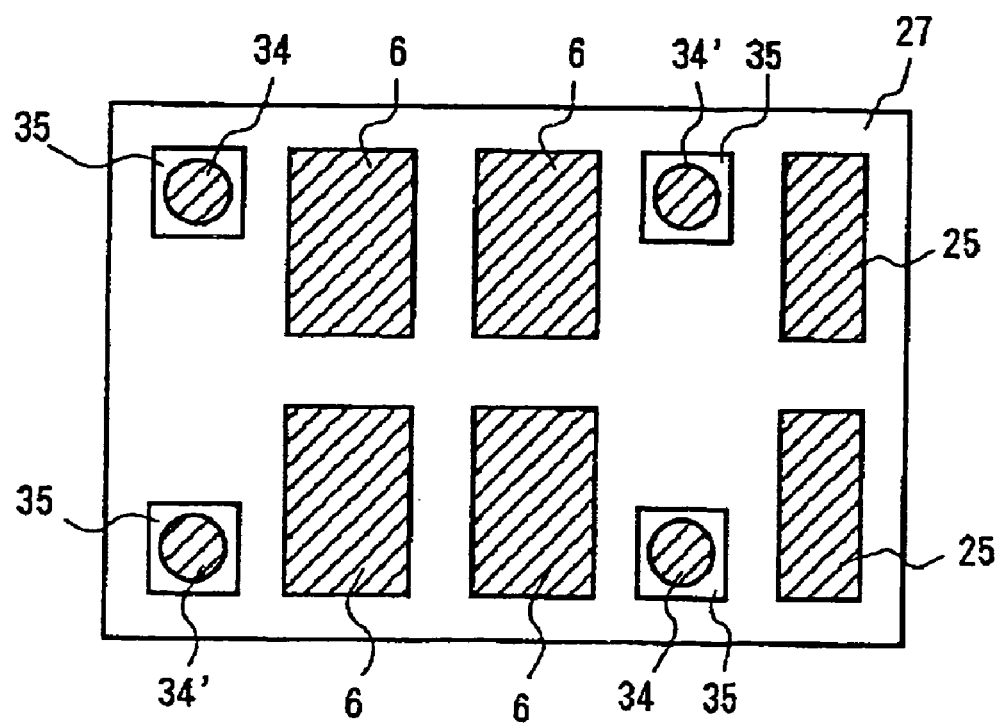

Since ball-shaped supports, unlike a support frame 72 as shown in FIG. 7, do not have the side walls, the areas of the circuit board 71 between the ball-shaped supports become available for mounting circuit components as shown in FIG. 8(*b*). The use of ball-shaped supports therefore increases the ratio of the circuit components-mountable area to the whole area of the circuit board, thereby making it possible to further decrease the area of the circuit board 71. This construction is hence effective in miniaturizing the piezoelectric oscillator.

Further, the circuit components 33 may be an IC chip. An IC chip is mounted on the circuit board 71 by the flip-chip bonding technique, for example, and then firmly fixed by injecting an adhesive into the space between the circuit board and the IC chip.

The ball-shaped supports may be fixed to the circuit board 71 with solder or a conductive adhesive. In addition, they may also be fixed by the flip-chip bonding technique as the IC chips. In this case, the supports and IC chip can be mounted on the circuit board by the same process, and hence the manufacturing process can be simplified.

In the case of using an IC chip, adjustment terminals for inputting adjustment signals may be required to make possible adjustment of the circuit settings of the IC if necessary after the piezoelectric oscillator is assembled. The adjustment terminals may be formed on the outer side of the crystal vibrator 41.

Figure 9:
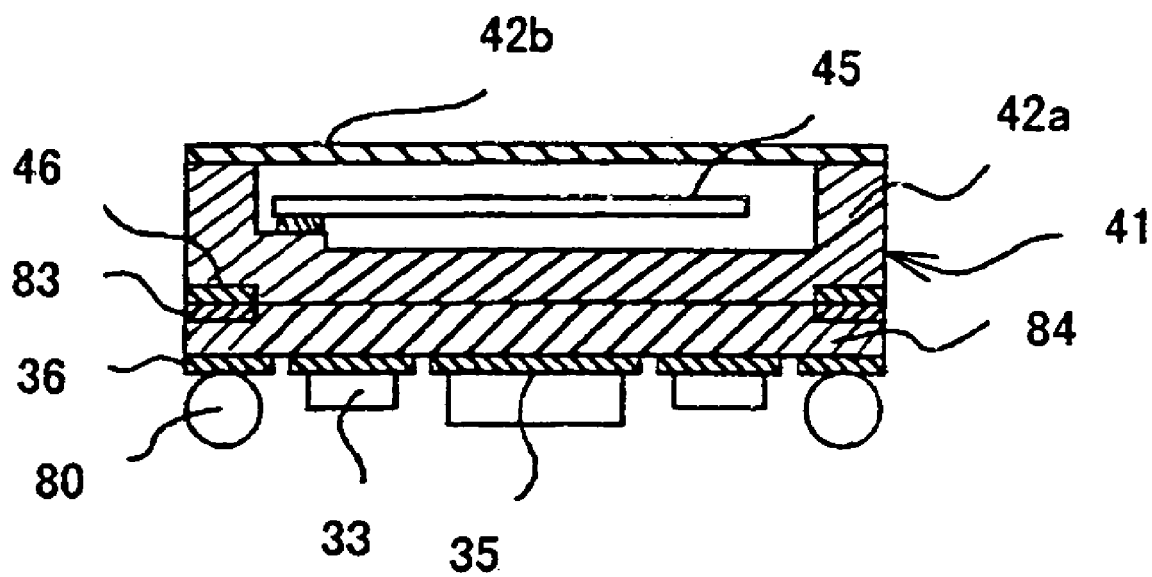
FIGS. 9 is a sectional view of the sixth embodiment of the piezoelectric oscillator according to the present invention.

FIG. 9 is a sectional view of the sixth embodiment of the piezoelectric oscillator according to the present invention. The sixth embodiment is characterized in that the bottom of a crystal vibrator is fixed to the top side of a circuit board with circuit components mounted on the bottom side in order to further miniaturize a piezoelectric oscillator.

Specifically, the sixth embodiment has a construction in which a flat circuit board 84 with circuit components 33 making up an oscillating circuit and a temperature-compensating circuit and metal balls 80 mounted on the bottom side and external terminals 83 formed on the top side and a crystal vibrator 41 are fixed together into a single piezoelectric oscillator by bonding the external terminals 46 of the crystal vibrator 41 to the external terminals 83 on the top side of the circuit board 84. The metal balls 80 serve as the supports and the terminals for external connection of the finished piezoelectric oscillator.

On the bottom side of the circuit board 84, lands 35 for mounting circuit components 33, lands 36 for fixing metal balls 80 to the circuit board 84 are formed. The circuit components 33 and the metal balls 80 are joined to the circuit board 84 by applying cream solder to the lands using silk-screen printing, placing the circuit components 33 and the metal balls 80 on the lands 35 and 36, and reflowing the solder.

Since the circuit components-mounted side (the bottom side) of the circuit board 84 is open, replacement or addition of circuit components can be easily made if necessary for adjustment of the oscillating frequency or other reason.

The metal balls 80 may also be bonded to the lands 36 of the circuit board 84 with a conductive adhesive after the circuit components 33 are mounted on the lands 35 by reflow soldering. Further, since the circuit board 84 is backed with the crystal vibrator 41 to maintain the flatness, a thinner circuit board can be used for the circuit board 84.

Next, the crystal vibrator 41, which is constructed as described above, is joined to the circuit board 84 by bonding the external terminals 46 of the crystal vibrator 41 to the external terminals 83 of the circuit board 84 with a conductive adhesive to complete the piezoelectric oscillator of this embodiment.

Figure 10:
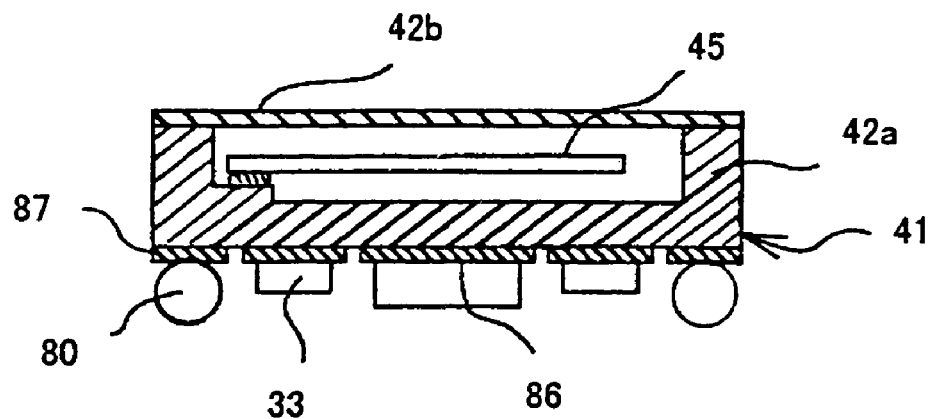
FIGS. 10(a) and (b) are a sectional view and a bottom view of the seventh embodiment of the piezoelectric oscillator according to the present invention.
Figure 10:
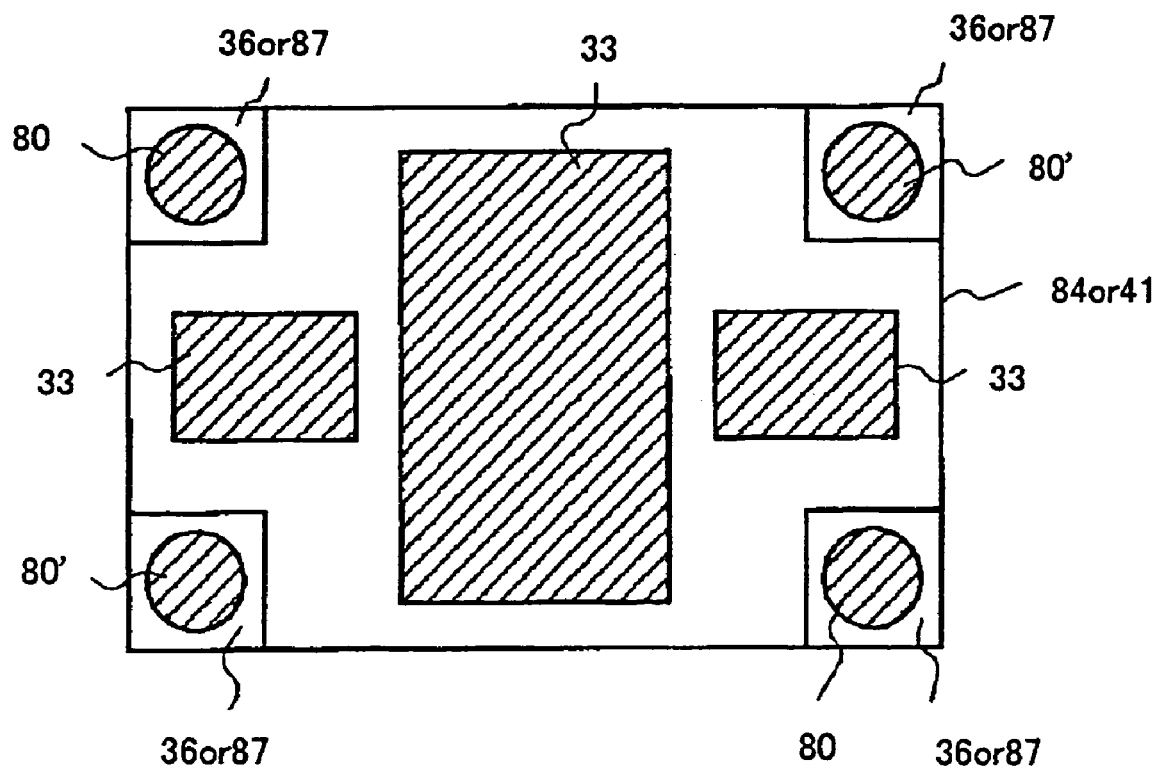
Figure 11:
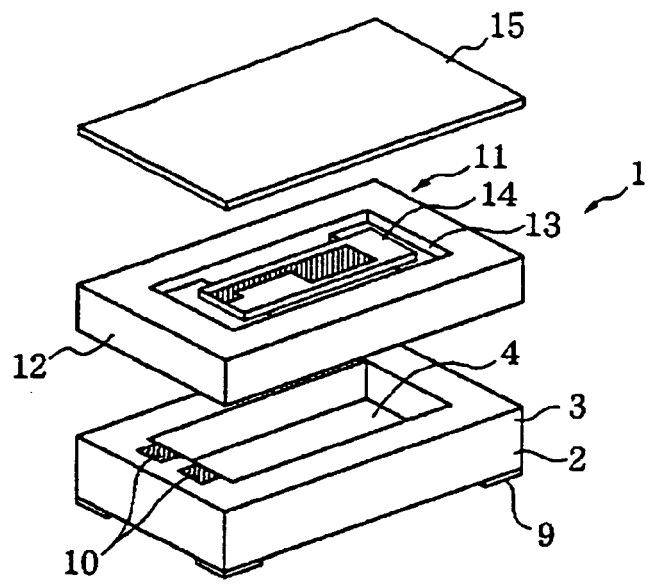
FIGS. 11(a) and (b) are an exploded perspective view and a sectional view of a conventional piezoelectric oscillator.
Figure 11:
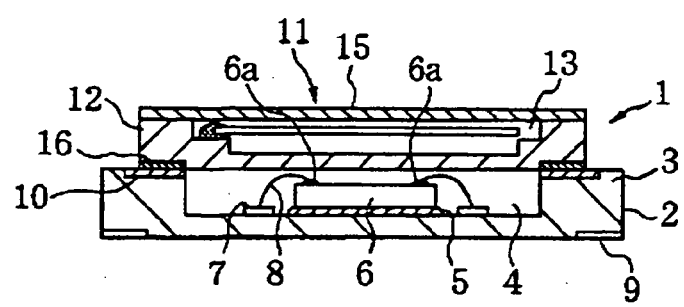
Figure 12:
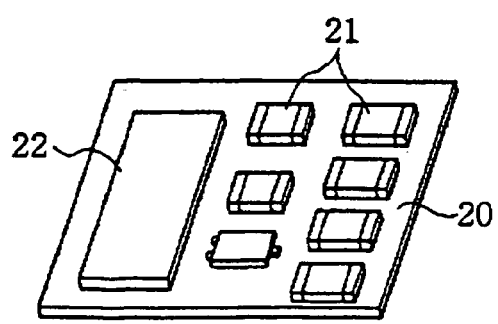
FIG. 12 shows a mounting method of the circuit components on the circuit board of a conventional piezoelectric oscillator.

FIG. 10(*a*) is a sectional view of the seventh embodiment of the piezoelectric oscillator according to the present invention. The seventh embodiment is characterized in that the circuit components making up an oscillating circuit and a temperature-compensating circuit and supports are mounted on the outer side of the bottom of the package of a crystal vibrator by forming the circuit patterns and the lands for the circuit components and the supports. This embodiment is intended to make the circuit board 84 shown in FIG. 9 unnecessary, thereby lowering the profile of the piezoelectric oscillator of the sixth embodiment.

Specifically, the seventh embodiment has a construction in which circuit patterns and lands 86 for circuit components and lands 87 for supports 86 are formed on the outer side of the bottom of the ceramic package 42*a* of the crystal vibrator 41, the circuit components of an oscillating circuit and a temperature-compensating circuit and metal balls 80 are mounted, a crystal vibrating element 45 is mounted in the depression of the package 42*a*; and the depression is the depression is hermetically sealed by a metal cover 42*b*. The metal balls 80 also serve as the supports and the terminals for external connection.

The circuit components 33 and the metal balls 80 are mounted to the outer side of the bottom of the ceramic package 42*a* by applying cream solder to the lands 86 and 87 using silk-screen printing, placing the circuit components 33 and the metal balls 80 onto the lands 86 and 87, and reflowing the solder.

Since the circuit components-mounted side, that is, the bottom of the crystal vibrator 41 is open, replacement or addition of circuit components can be easily made if necessary for adjustment of the oscillating frequency or other reason.

The metal balls 80 may also be bonded to the lands 87 on the bottom of the ceramic package 42a with a conductive adhesive after the circuit components 33 alone are mounted on the lands 86 by reflow soldering.

Further, the circuit components 33 and the metal balls 80 may be mounted to the lands 86 and 87 on the bottom of the ceramic package 42a after the crystal vibrator 41 is completed by mounting a crystal vibrating element 45 in the depression of the package 42a and hermetically sealing the depression by means of a metal cover 42b. By this method, only good crystal vibrators 41 can be used.

Although the sixth and seventh embodiments are described using the metal balls 80 for the supports, ceramic blocks with terminals formed on the top and bottom sides and connected by a conductor, or metal blocks, shaped like a polygonal prism such as triangular or square prism or a round column such as circular column or elliptic column may also be used for the supports.

In the case of using polygonal column-shaped supports, the direction of the mounted supports must be aligned so that a corner portion of the polygonal column-shaped supports does not protrude from the edge of the circuit board if required.

In the case of using round column-shaped supports, the process for aligning the direction of the mounted supports is not required because round column-shaped supports do not have corners. Round column-shaped supports therefore has the advantage of being able to simplifying the fabricating process in comparison with polygonal column-shaped supports.

FIG. 10(*b*) is a bottom view which shows the circuit components-mounted side of the crystal vibrator 41 of the seventh embodiment and that of the circuit board 84 of the sixth embodiment.

As known from the figure, the sixth and seventh embodiments also use metal balls 80 for the support as the fifth embodiment, and hence circuit components can be disposed between the metal balls 80 and 80' as shown in FIG. 10(*b*). The sixth and seventh embodiments therefore have a higher ratio of the circuit components-mountable area to the whole area of the circuit board 84 or to the bottom of the crystal vibrator 41, and are effective constructions to miniaturize a piezoelectric oscillator.

Further, the circuit components 33 may be an IC chip. An IC chip is mounted on the lands 86 formed on the bottom of the crystal vibrator 41 by the flip-chip bonding technique, for example, and may be further bonded to the crystal vibrator with an adhesive to firmly fix them.

The ball-shaped supports may be fixed to the bottom of the crystal vibrator 41 with solder or a conductive adhesive. They may also be fixed by the flip-chip bonding technique as the IC chip. In this case, the supports and IC chip can be mounted on the bottom of the crystal vibrator 41 by the same process, and hence the fabricating process can be simplified.

Furthermore, in the sixth and seventh embodiments, at least one of a plurality of the supports may be different from the others in shape and/or size so that the terminals arrangement of the piezoelectric oscillator can be readily identified.

In the case where the columnlike supports are ceramic blocks such that terminals formed on the top and bottom are connected by a metal layer formed by metallization, the metal layer can be used as a castration(?) surface which makes it possible to visually check the condition of connection by soldering when mounting the piezoelectric oscillator to a circuit board or mounting the crystal vibrator on the circuit board.

As described above, the present invention provides a piezoelectric oscillator having a construction in which a circuit board with circuit components making up an oscillating circuit and a temperature-compensating circuit mounted on one side and a piezoelectric vibrator with a piezoelectric vibrating element housed in a package are joined together into a single device. By using a flat circuit board to make it possible to apply cream solder to the lands on the circuit board by silk-screen printing, the piezoelectric oscillator is suitable for mass production by a batch process. And by stacking the packaged crystal vibrator above the circuit board with a predetermined space in a three-dimensional arrangement, the area occupied by the piezoelectric oscillator is significantly reduced.

In addition, by using separate columnlike supports for mechanically and electrically connecting the circuit board and the crystal vibrator, quantity production by a batch process is made possible.

As understood from the above description, the inventions included herein are summarized as follows:

The invention of claim 1 holds a piezoelectric vibrator above a circuit board with circuit components making up an oscillating circuit and a temperature-compensating circuit mounted thereon and electrically connects the bottom terminals of the piezoelectric vibrator and the lands formed on the circuit board by means of columnlike supports separate from the piezoelectric vibrator and the circuit board.

This invention makes it possible to construct a piezoelectric oscillator with a decreased board occupation area using a flat circuit board. Therefore, quantity production of the circuit boards by a batch process is made possible, and the footprint size of the piezoelectric oscillator can be made smaller.

The invention of claim 2 uses for the columnlike supports ceramic blocks each of which has a top terminal and a bottom terminal formed on the top and the bottom, respectively, and connected with each other. The cost of the columnlike supports can be reduced.

The invention of claim 3 uses metal blocks or metal balls for the columnlike supports. The construction of the columnlike supports can be further simplified, the cost can be reduced, and the productivity can be increased.

The invention of claim 4 uses the highest mounted height circuit components for the columnlike supports. By this invention, the columnlike supports are not required, and the piezoelectric oscillator can be manufactured with a reduced number of parts.

The invention of claim 5 uses columnlike supports with a circular, elliptic or egg-shaped cross section. Therefore, no part of them protrudes from the edge of the circuit board and becomes burrs if they move out of position in the direction of rotation.

The inventions of claims 6 and 7 hold a piezoelectric vibrator with a piezoelectric vibrating element housed in a hermetically sealed package above a circuit board with circuit components making up an oscillating circuit and a temperature-compensating circuit mounted thereon and electrically connects the bottom terminals of the piezoelectric vibrator and the lands formed on the circuit board by means of nonconductive supports separate from the piezoelectric vibrator and the circuit board, the nonconductive supports having terminals formed on the top and the bottom and connected together by a conductor. By this invention, the top-viewed shape of the piezoelectric oscillator can be made smaller.

The invention of claim 8 is a method of manufacturing a piezoelectric oscillator in which a piezoelectric vibrator and a circuit board with circuit components making up an oscillating circuit and a temperature-compensating circuit mounted thereon are joined together with columnlike supports, each of columnlike supports being a nonconductive body with terminals formed on the top and the bottom and connected by a connecting conductor, put between them, comprising the following steps: forming a plurality of the circuit boards for the piezoelectric oscillators on one mother ceramic plate to produce a circuit board block by manufacturing a circuit board block consisting of a plurality of the circuit boards for the piezoelectric oscillators by forming wiring patterns, lands and external terminals in each partition on a mother circuit board and mounting the circuit components on each circuit board for the piezoelectric oscillator; manufacturing a columnlike supports block consisting of a latticelike part defining the holes corresponding to the circuit boards of the circuit board bock and columnlike supports projecting into the holes from the latticelike part by forming holes in a large-area mother ceramic plate, and forming a conductor layer on the top and bottom side of the columnlike supports block and connecting the conductor layers on both sides of the columnlike supports block;

Bonding the columnlike supports of the columnlike supports block to the corresponding lands of the circuit board block with a conductive adhesive or solder by placing the columnlike supports block on the circuit board block; cutting the circuit board block together with the columnlike supports block to separate the individual circuit boards; and mounting the piezoelectric oscillator on the columnlike supports mechanically and electrically joining the bottom terminals of the piezoelectric vibrator and the conductive layers on the top of the columnlike supports.

This method makes possible quantity production by a batch process, and the increased productivity makes possible a cost reduction.

The invention of claim 9 manufactures a columnlike supports block consisting of a latticelike part and columnlike supports projecting from the latticelike part into the spaces defined by the latticelike part like a peninsula.

This method makes possible quantity production by a batch process, and the increased productivity makes possible a cost reduction.

The invention of claim 10 uses for the circuit board a circuit board having a larger surface area than the outside dimensions of the supporting frame for holding the piezoelectric vibrator and mounts circuit components such as capacitors for fine adjustment of the oscillating frequency on the area of the circuit board outside the support frame. This invention makes it possible to make fine adjustment of the oscillating frequency.

The invention of claim 11 uses metal balls for the supports. By this construction, it is made possible to use the surface area of the circuit board more effectively, and the piezoelectric oscillator can be further miniaturized.

The invention of claim 12 is a piezoelectric oscillator in which a circuit board with circuit components making up an oscillating circuit and a temperature-compensating circuit mounted on the bottom side and external terminals formed on the top side and a piezoelectric vibrator are joined together by bonding the bottom terminals of the piezoelectric vibrator and the external terminals on the top side of the circuit board, and in addition metal balls attached to the bottom side of the circuit board are used as terminals for external connection. By this construction, the piezoelectric oscillator can be further miniaturized.

The invention of claim 13 is a piezoelectric oscillator in which circuit patterns and lands are formed on the bottom of the piezoelectric vibrator and circuit components making up an oscillating circuit and a temperature-compensating circuit and metal balls are mounted on the bottom of the piezoelectric vibrator, and the metal balls serve as the terminals for external connection. This construction can lower the profile of the piezoelectric oscillator.

What is claimed is:

1. A piezoelectric oscillator, characterized by comprising a piezoelectric vibrator with a piezoelectric vibrating element housed in a package and bottom terminals formed on the outer side of a flat bottom of the package, a flat circuit board with circuit components mounted and lands formed on a top side, and supports are provided on the top side of the circuit board and mechanically and electrically connects the bottom terminals of the piezoelectric vibrator and the conductor patterns on the circuit board and a top of said supports being mechanically and electrically bonded to said bottom terminals of said piezoelectric vibrator.

2. The piezoelectric oscillator of claim 1, wherein said supports are ceramic blocks with conductors formed on the top and the bottom and connected by a connecting conductor.

3. The piezoelectric oscillator according to claim 1, wherein said supports are metal blocks or balls which are circular, elliptic, or oval in cross section.

4. A piezoelectric oscillator comprising a flat circuit board with circuit components making up an oscillating circuit mounted on the top side and external terminals formed on the bottom side and a piezoelectric vibrator fixed above the circuit board with a predetermined space by supports mounted to the top side of the circuit board, characterized in that the piezoelectric vibrator has a piezoelectric vibrating element housed in a hermetically sealed package and bottom terminals connected with the excitation electrodes of the piezoelectric vibrating element formed on the outer side of the bottom of the package; and the supports are separate parts from the piezoelectric vibrator and the circuit board, the bottom of the supports being mechanically and electrically fixed to lands formed on the top side of the circuit board, and the top of the supports being mechanically and electrically bonded to the bottom terminals of the piezoelectric vibrator.

5. The piezoelectric oscillator of any one of claims 1 to 4, wherein said supports are metal blocks or metal balls.

6. The piezoelectric oscillator of any one of claims 1 to 4, wherein said supports comprise circuit components with a highest mounted height.

7. The piezoelectric oscillator according to claim 4, wherein said supports are metal blocks or balls which are circular, elliptic, or oval in cross section.

8. A piezoelectric oscillator comprising a flat circuit board with at least circuit components making up an oscillating circuit mounted on the top side and external terminals formed on the bottom side and a piezoelectric vibrator, fixed together and electrically connected by means of supports, characterized in that:

the supports are small pieces of an insulating material with conductors formed on the top and the bottom and connected by a connecting conductor;

the circuit board has support-fixing lands for bonding the conductors on the bottoms of the supports thereto formed on the top side; and the piezoelectric vibrator houses a piezoelectric vibrating element in a hermetically sealed package and has bottom terminals to be bonded to the conductors on the tops of the supports fanned on the bottom of the package.

9. The piezoelectric oscillator of any one of claims 1 to 8, wherein said supports are circular, elliptic, or oval in cross section.

10. The piezoelectric oscillator according to claim 8, wherein said supports are circular, elliptic, or oval in cross section and are made from ceramic with conductor formed on the top and bottom connected together by a connecting conductor.

11. A method of manufacturing a piezoelectric oscillator comprising a flat circuit board with at least circuit components making up an oscillating circuit mounted on the top side and external terminals formed on the bottom side and a piezoelectric vibrator with a piezoelectric vibrating element housed in a hermetically sealed package and bottom terminals formed on the outer side of the bottom of the package, fixed together and electrically connected by supports with conductors formed on the top and bottom and connected by a connecting conductor, characterized by comprising the following steps:

forming the circuit patterns, support-fixing lands and terminals for the piezoelectric oscillator in each partition on a large parent circuit board and mounting the circuit components for the piezoelectric oscillator on each partition on the parent circuit board to form a block of the circuit boards of the piezoelectric oscillators;

making a block of the supports which are disposed to fit on the support-fixing lands of the corresponding circuit boards of the block of the circuit boards and fixing the supports of the block of the supports to the support-fixing lands on the corresponding circuit boards of the block of the circuit boards, electrically connecting the conductor on the bottom of each support and the support-fixing land by putting the block of the supports onto the block of the circuit boards;

cutting the block of the circuit boards together with the block of the supports to separate the individual circuit boards; and mounting the crystal vibrator on the supports of each circuit board by bonding the bottom terminals of the piezoelectric vibrator to the conductors on the tops of the supports.

12. The method of manufacturing a piezoelectric oscillator of claim 11, wherein the block of the supports comprises a latticework part with holes corresponding to the circuit boards of the block of the circuit boards and the supports projecting from the latticework part into each hole so as to fit on the support-fixing lands of the corresponding circuit board.

13. A piezoelectric oscillator comprising a flat circuit board with circuit components making up an oscillating circuit mounted on the top side and bottom terminals formed on the bottom side and a piezoelectric vibrator held above the circuit board with a predetermined space by a support frame, characterized in that;

the piezoelectric vibrator has a piezoelectric vibrating element housed in a hermetically sealed package and bottom terminals on the outer side of the bottom of the package;

the support frame has terminals for connecting the bottom terminals of the piezoelectric vibrator thereto on the top side and terminals for being connected to the circuit board formed on the bottom side; and the circuit board has a larger surface area than the outside dimensions of the support frame, and has lands for connecting the bottom terminals of the support frame thereto and lands for mounting circuit components thereon inside and outside the support frame on the top side of the circuit board.

14. The piezoelectric oscillator of claim 13, wherein a plurality of metals are used instead of the support frame.

15. A piezoelectric oscillator comprising a flat circuit board with circuit components making up an oscillating circuit mounted on the bottom side, lands formed on a bottom side of the flat circuit board and external terminals formed on the top side and a piezoelectric vibrator with bottom terminals formed on the bottom of a package housing said piezoelectric vibrator, said circuit board and said piezoelectric vibrator being fixed together by bonding the external terminals of the circuit board and the bottom terminals of the piezoelectric vibrator; and metal balls serving as supports are fixed to the lands of the circuit board.

16. A piezoelectric oscillator, characterized by having a piezoelectric vibrating element housed in a hermetically sealed package, circuit patterns for an oscillating circuit and lands for fixing supports thereto formed on a bottom of the package, and circuit components and metal balls as supports and terminals of the package being mounted on the bottom of the package.

* * * * *

UNITED STATES PATENT AND TRADEMARK OFFICE
CERTIFICATE OF CORRECTION

PATENT NO. : 7,023,288 B2
APPLICATION NO. : 10/475072
DATED : April 4, 2006
INVENTOR(S) : Hitoshi Takanashi et al.

It is certified that error appears in the above-identified patent and that said Letters Patent is hereby corrected as shown below:

Title Page;
Item [54] Title of Invention:

Change "Piezoelectric Oscillator and Its Manufacturing Method" to
--PIEZOELECTRIC OSCILLATOR AND A METHOD OF MANUFACTURING THE SAME--

Signed and Sealed this

Twenty-first Day of April, 2009

JOHN DOLL
*Acting Director of the United States Patent and Trademark Office*

UNITED STATES PATENT AND TRADEMARK OFFICE
CERTIFICATE OF CORRECTION

| | | |
|---|---|---|
| PATENT NO. | : 7,023,288 B2 | Page 1 of 1 |
| APPLICATION NO. | : 10/475072 | |
| DATED | : April 4, 2006 | |
| INVENTOR(S) | : Hitoshi Takanashi et al. | |

It is certified that error appears in the above-identified patent and that said Letters Patent is hereby corrected as shown below:

Title Page Item (54) and Column 1, lines 1 and 2
Title of Invention:

Change "Piezoelectric Oscillator and Its Manufacturing Method" to
--PIEZOELECTRIC OSCILLATOR AND A METHOD OF MANUFACTURING THE SAME--

This certificate supersedes the Certificate of Correction issued April 21, 2009.

Signed and Sealed this

Twelfth Day of May, 2009

JOHN DOLL
*Acting Director of the United States Patent and Trademark Office*